(12) United States Patent
Shen et al.

(10) Patent No.: US 11,950,357 B2
(45) Date of Patent: Apr. 2, 2024

(54) CIRCUIT BOARD FOR TRANSMITTING HIGH-FREQUENCY SIGNAL AND METHOD FOR MANUFACTURING THE SAME

(71) Applicants: QING DING PRECISION ELECTRONICS (HUAIAN) CO.,LTD, Huai an (CN); Avary Holding (Shenzhen) Co., Limited., Shenzhen (CN)

(72) Inventors: Fu-Yun Shen, Shenzhen (CN); Hong-Yan Guo, Shenzhen (CN); Hsiao-Ting Hsu, New Taipei (TW); Ming-Jaan Ho, New Taipei (TW)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 363 days.

(21) Appl. No.: 17/607,792

(22) PCT Filed: Nov. 27, 2019

(86) PCT No.: PCT/CN2019/121283
§ 371 (c)(1),
(2) Date: Oct. 29, 2021

(87) PCT Pub. No.: WO2021/102740
PCT Pub. Date: Jun. 3, 2021

(65) Prior Publication Data
US 2022/0232696 A1 Jul. 21, 2022

(51) Int. Cl.
*H05K 1/02* (2006.01)
*H05K 1/09* (2006.01)
(Continued)

(52) U.S. Cl.
CPC .......... *H05K 1/0237* (2013.01); *H05K 1/092* (2013.01); *H05K 3/0035* (2013.01); *H05K 3/022* (2013.01);
(Continued)

(58) Field of Classification Search
CPC .... H05K 1/0237; H05K 1/092; H05K 3/0035; H05K 3/022
See application file for complete search history.

(56) References Cited

U.S. PATENT DOCUMENTS

2018/0332707 A1  11/2018  Akahoshi et al.

FOREIGN PATENT DOCUMENTS

| CN | 102630118 A | 8/2012 |
|----|-------------|--------|
| CN | 103313512 A | 9/2013 |

*Primary Examiner* — Jeremy C Norris
(74) *Attorney, Agent, or Firm* — ScienBiziP, P.C.

(57) ABSTRACT

A method for manufacturing a circuit board circuit board for transmitting high-frequency signal, including: providing a first-line circuit board (20), a second circuit board (40), at least one third circuit board (50), a fourth circuit board (60), a fifth circuit board (61), and a sixth circuit board (62); stacking the first circuit board (20), the second circuit board (40), and third circuit board (50) in that order, and stacking the fourth circuit board (60), the sixth circuit board (62), and the fifth circuit board (61) on the third circuit board (50), and pressing them together to obtain the circuit board circuit board for transmitting high-frequency signal. The method manufacturing the circuit board circuit board for transmitting high-frequency signal can reduce a width of the transmission line. The present disclosure further provides the circuit board circuit board for transmitting high-frequency signal obtained by the above method.

10 Claims, 4 Drawing Sheets

(51) Int. Cl.
*H05K 3/00* (2006.01)
*H05K 3/02* (2006.01)
*H05K 3/42* (2006.01)
*H05K 3/46* (2006.01)

(52) U.S. Cl.
CPC ........... *H05K 3/423* (2013.01); *H05K 3/4644* (2013.01); *H05K 2201/0355* (2013.01); *H05K 2201/09563* (2013.01)

CIRCUIT BOARD FOR TRANSMITTING HIGH-FREQUENCY SIGNAL AND METHOD FOR MANUFACTURING THE SAME

FIELD

The subject matter relates to circuit boards, and more particularly, to a circuit board for transmitting high-frequency signal and a method for manufacturing the circuit board.

BACKGROUND

Transmission lines are linear structures for transmitting electromagnetic signals, which are widely used in various electronic devices and electronic equipments. In mobile phones, considering the integrity of signal transmission and the mutual interference between a power line, a signal line, and a control line, the transmission line is designed to have the structure of a stripline. However, such design leads to a large width of transmission line, which fails to meet actual needs.

SUMMARY

Therefore, a circuit board for transmitting high-frequency signal is needed, which can reduce the wide of the transmission line.

An embodiment of the present disclosure provides a method for manufacturing a circuit board for transmitting high-frequency signal, including providing a first circuit board, the first circuit board including a first conductive wiring layer, a first base layer, and a second conductive wiring layer stacked in that order; providing a second circuit board, the second circuit board including a second base layer and a third conductive wiring layer stacked together, the third conductive wiring layer including at least one power line, at least one signal line, at least one control line, at least two first ground lines, and at least one second ground line, the signal line and the control line disposed at opposite sides of the power line, the first ground lines disposed at opposite sides of the signal line, the second ground line disposed at a side of the control line away from the power line, the second circuit board divided into a first region containing the signal line and a second region besides the first region, the second region the power line and the control line disposed in the second region; providing at least one third circuit board, each third circuit board including a third base layer and a fourth conductive wiring layer stack together; providing a fourth circuit board, the fourth circuit board including a fourth base layer and a fifth conductive wiring layer stacked together, the fifth conductive wiring layer including at least one power line or at least one control line; providing a fifth circuit board, the fifth circuit board including a fifth base layer and a sixth conductive wiring layer stacked together, and the sixth conductive wiring layer including at least one power line or at least one control line; providing a sixth circuit board, the sixth circuit board including a sixth base layer and a seventh conductive wiring layer stacked together, the seventh conductive wiring layer being a ground shielding layer; stacking the first circuit board, the second circuit board, and the third circuit board, and stacking the fourth circuit board, the sixth circuit board, and the fifth circuit board on the third circuit board, causing the sixth circuit board to be between the fourth circuit board and the fifth circuit board, and pressing them to cause each of the fourth circuit board, the sixth circuit board, and the fifth circuit board to correspond to the first region.

Furthermore, the method can further include cutting the circuit board signal to form two terminal areas and a transmission line area between the terminal areas, each terminal area including a portion of the circuit board corresponding to the first region and another portion of circuit board corresponding to the second region, the transmission line area including another portion of the circuit board corresponding to the first region.

Another embodiment of the present disclosure also provides a circuit board for transmitting high-frequency signal, including: a first circuit board including a first conductive wiring layer, a first base layer, and a second conductive wiring layer stacked in that order; a second circuit board including a second base layer and a third conductive wiring layer stacked together, the third layer including at least one power line, at least one signal line, at least two first ground lines, at least one second ground lines, the signal line and the control line disposed at opposite sides of the power line, the first ground lines disposed at opposite sides of the signal line, the second ground line disposed at a side of the control line away from the power line, the second circuit board divided into a first region containing the signal line and a second region besides the first region, the second region the power line and the control line disposed in the second region; at least one third circuit board each including a third base layer and a fourth conductive wiring layer stacked together; a fourth circuit board including a fourth base layer and a fifth conductive wiring layer stacked together, the fifth conductive wiring layer including at least one power line or at least one control line; a sixth circuit board including a sixth base layer and a seventh conductive wiring layer stacked together; a fifth circuit board including a fifth base layer and a sixth conductive wiring layer stacked together, and the sixth conductive wiring layer including at least one power line or at least one control line; wherein the first circuit board, the second circuit board, the third circuit boards are stacked in that order, the fourth circuit board, the sixth circuit board, and the fifth circuit board are disposed on the third circuit board and correspond to the first region, the sixth circuit board is disposed between the fourth circuit board and the fifth circuit board.

Furthermore, the circuit board can include two terminal areas and a transmission line area between the terminal areas, each terminal area include a portion of the circuit board corresponding to the first region and another portion of the circuit board corresponding to the second region, the transmission line area includes another portion of the circuit board corresponding to the first region.

In the present disclosure, the power line and the control line in the transmission line area of the circuit board 100 are vertically disposed above the signal line, thereby preventing the power line, the control line, and the signal line from being on a same horizontal position. Thus, the width of the transmission line area can be reduced. In addition, the power line and the control line are separated arranged, that is, the power line and the control line are isolated from each other by the seventh conductive wiring layer, thereby avoiding the mutual interference between the power line and the control line, thus improve the signal transmission quality.

NUMERIC DESCRIPTION FOR MAIN ELEMENTS

Figure 1:
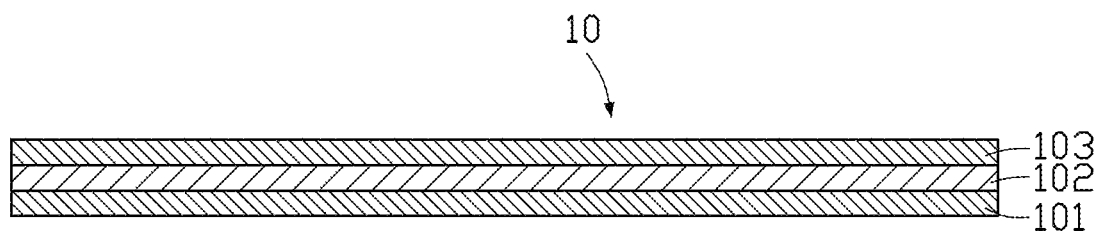
FIG. 1 is a diagrammatic view of an embodiment of a first copper-clad laminate according to the present disclosure.

Circuit board for transmitting high-frequency signal 100
First copper-clad laminate 10
First copper foil layer 101
First base layer 102
Second copper foil layer 103
First conductive wiring layer 104
Second conductive wiring layer 105
First blind hole 11
First conductive portion 12
First circuit board 20
Second copper-clad laminate 30
Second base layer 301
Third copper foil layer 302
Third conductive wiring layer 31
Power line 311
Signal line 312
Control line 313
Second conductive portion 32
Second circuit board 40
First region 41
Second region 42
Third circuit board 50
Third base layer 501
Fourth conductive wiring layer 502
Third conductive portion 51
Fourth circuit board 60
Fourth base layer 601
Fifth conductive wiring layer 602
Fifth circuit board 61
Fifth base layer 611
Sixth conductive wiring layer 612
Sixth circuit board 62
Sixth base layer 621
Seventh conductive wiring layer 622
Intermediate body 70

Stepped portion 71
Solder mask layer 80
Adhesive layer 81

Implementations of the present disclosure will now be described, by way of embodiments, with reference to the attached figures.

DETAILED DESCRIPTION OF EMBODIMENTS

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are not to be considered as limiting the scope of the embodiments.

Implementations of the disclosure will now be described, by way of embodiments only, with reference to the drawings. It should be noted that non-conflicting details and features in the embodiments of the present disclosure may be combined with each other.

The present disclosure provides a method for manufacturing a circuit board for transmitting high-frequency signal, which includes following steps.

Step S1, referring to FIG. 1, a first copper-clad laminate 10 is provided.

The first copper-clad laminate 10 includes a first copper foil layer 101, a first base layer 102, and a second copper foil layer 103 stacked in that order. In an embodiment, the first copper-clad laminate 10 is a flexible copper-clad laminate (FCCL).

The first base layer 102 can be made of a resin selected from a group consisting of liquid crystal polymer (LCP), polyphenylene sulfide (PPS), poly tetra fluoroethylene (PTFE), epoxy resin, polypropylene (PP), BT resin, polyphenylene oxide (PPO), polyimide (PI), perfluoroalkoxy, polyethylene terephthalate (PET), and polyethylene naphthalate (PEN). In an embodiment, the first base layer 102 is made of polyimide.

Figure 2:
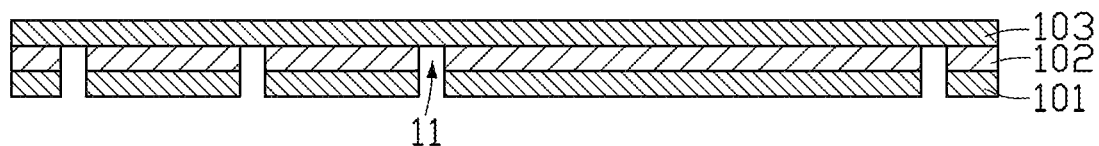
FIG. 2 is a diagrammatic view showing a first blind hole being defined in the first copper-clad laminate of FIG. 1.

Step S2, referring to FIG. 2, at least one first blind hole 11 is defined in the first copper-clad laminate 10, which passes through the first copper foil layer 101 and the first base layer 102.

The first blind hole 11 does not penetrate the second copper foil layer 103, that is, a bottom of the first blind hole 11 is closed by the second copper foil layer 103. The first blind hole 11 can be formed by laser drilling. The position and the number of the first blind hole(s) 11 can be changed according to actual needs.

Figure 3:
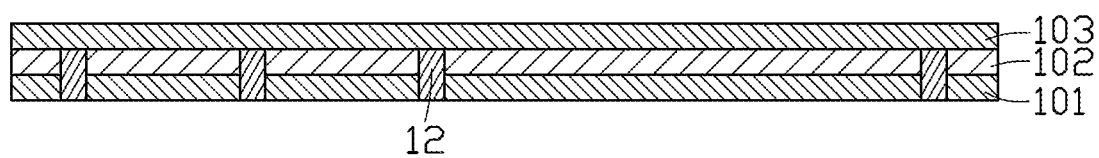
FIG. 3 is a diagrammatic view showing electroplating in the first blind hole of FIG. 2.

Step S3, referring to FIG. 3, a first conductive portion 12 is formed in each first blind hole 11 by electroplating.

The first conductive portion 12 is electrically connected to the second copper foil layer 103, and an end of the first conductive portion 12 away from the second copper foil layer 103 can be substantially flush with the first copper foil layer 101.

In an embodiment, copper is used for electroplating. In other embodiments, a conductive material may be filled in each first blind hole 11 to form the first conductive portion 12. The conductive material can be a conductive paste (such as solder paste), a metal (such as copper), etc.

Figure 4:
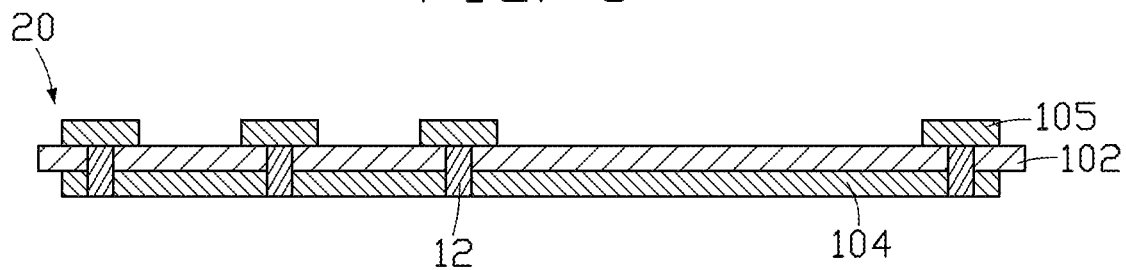
FIG. 4 is a diagrammatic view showing a first copper foil layer and a second copper foil layer of FIG. 3 being etched.

Step S4, referring to FIG. 4, the first copper foil layer 101 and the second copper foil layer 103 are etched to form a first conductive wiring layer 104 and a second conductive wiring layer 105, respectively. Then, a first circuit board 20 is obtained.

The first conductive wiring layer 104 and the second conductive wiring layer 105 are formed by an exposure and development process.

Figure 5:
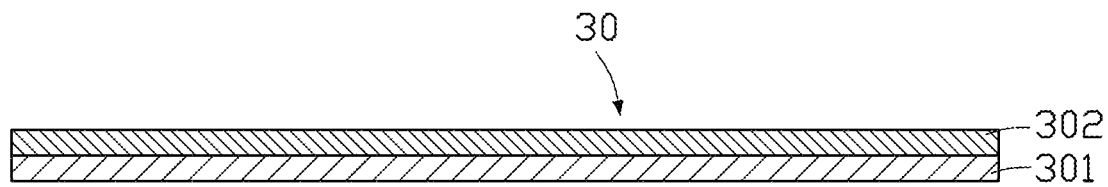
FIG. 5 is a diagrammatic view of an embodiment of a second copper-clad laminate according to the present disclosure.

Step S5, referring to FIG. 5, at least one second copper-clad laminate 30 is provided.

Each second copper-clad laminate 30 includes a second base layer 301 and a third copper foil layer 302 stacked together. In an embodiment, the second copper-clad laminate 30 is a flexible copper-clad laminate (FCCL).

The second base layer 301 can be made of a resin selected from a group consisting of liquid crystal polymer (LCP), polyphenylene sulfide (PPS), poly tetra fluoroethylene (PTFE), epoxy resin, polypropylene (PP), BT resin, polyphenylene oxide (PPO), polyimide (PI), perfluoroalkoxy, polyethylene terephthalate (PET), and polyethylene naphthalate (PEN). In an embodiment, the second base layer 301 is made of polyimide.

Figure 6:
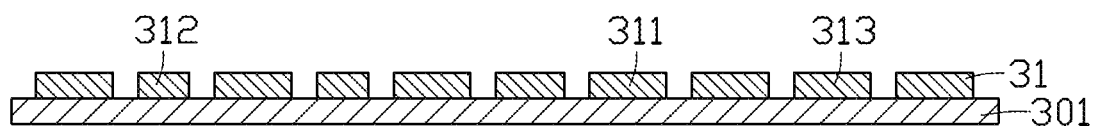
FIG. 6 is a diagrammatic view of a third copper foil layer of FIG. 5 being etched.

Step S6, referring to FIG. 6, the third copper foil layer 302 is etched to form a third conductive wiring layer 31.

The third conductive wiring layer 31 includes at least one power line 311, at least one signal line 312, at least one control line 313, at least two first ground lines (not label in the figures), and at least one second ground line (not label in the figures). The signal line 312 and the control line 313 are disposed on opposite sides of the power line 311. The first ground lines are disposed on opposite sides of the signal line 312, and the second ground line is disposed on a side of the control line 313 away from the power line 311. The control line 313 can transmit a control signal. The third conductive wiring layer 31 can be formed by an exposure and development process.

Figure 7:
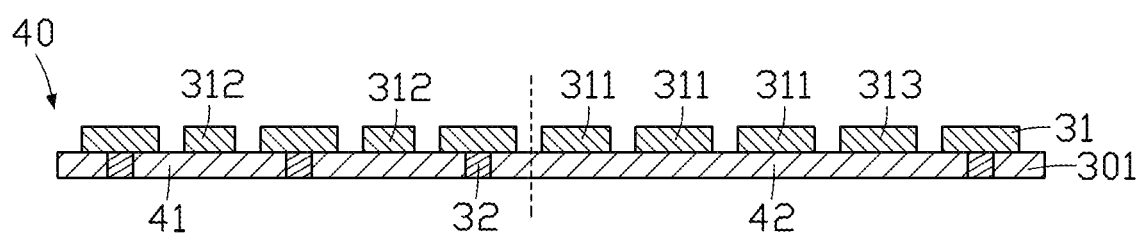
FIG. 7 is a diagrammatic view showing a second blind hole being defined in the second copper-clad laminate of FIG. 6, and a conductive material being filled in the second blind hole.

Step S7, referring to FIG. 7, at least one second blind hole (not labeled) is defined in each second copper-clad laminate 30, which passes through the second base layer 301.

The second blind hole does not pass through the third conductive wiring layer 31, that is, a bottom of the second blind hole is closed by the third conductive wiring layer 31. The second blind hole can be formed by laser drilling. The position and number of the second blind hole(s) can be changed according to actual needs.

Step S8, a conductive material is filled in each second blind hole to form a second conductive portion 32. Then, a second circuit board 40 is obtained.

The second conductive portion 32 is electrically connected to the third conductive wiring layer 31, and an end of the second conductive portion 32 away from the third conductive wiring layer 31 can be substantially flush with the second base layer 301.

The second circuit board 40 is divided into a first region 41 containing the signal line 312 and a second region 42 besides the first region 41. The power line 311 and the control line 313 are disposed in the second region 42.

The conductive material can be a conductive paste (such as solder paste), metal (such as copper), etc. In an embodiment, the conductive material is conductive paste.

Figure 8:
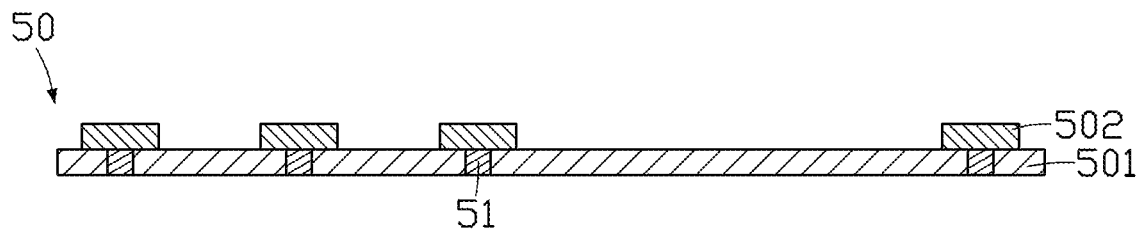
FIG. 8 is a diagrammatic view of an embodiment of a third circuit board according to the present disclosure.

Step S9, referring to FIG. 8, at least one third circuit board 50 is provided, which includes a third base layer 501 and a fourth conductive wiring layer 502 stacked together. At least one third conductive portion 51 is disposed in the third base layer 501, which is electrically connected to the fourth conductive wiring layer 502. The method for manufacturing the third circuit board 50 can be substantially the same as that for manufacturing the second circuit board 40. That is, the fourth conductive wiring layer 502 can be obtained by etching a copper foil layer through the exposure and development process, and the third conductive portion 51 can also be obtained by defining a blind hole in the third base layer 501 and filling a conductive material therein.

In detail, a third copper-clad laminate (not shown) is provided, which includes the third base layer 501 and a fourth copper foil layer (not shown) stacked together. The fourth copper foil layer is etched to form the fourth conductive wiring layer 502. At least one third blind hole (not shown) is defined in the third copper-clad laminate, which passes through the third base layer 501; And the third circuit board 50 is obtained by filling each third blind hole with conductive material to form the third conductive portion 51 electrically connected to the fourth conductive wiring layer 502.

Figure 9:
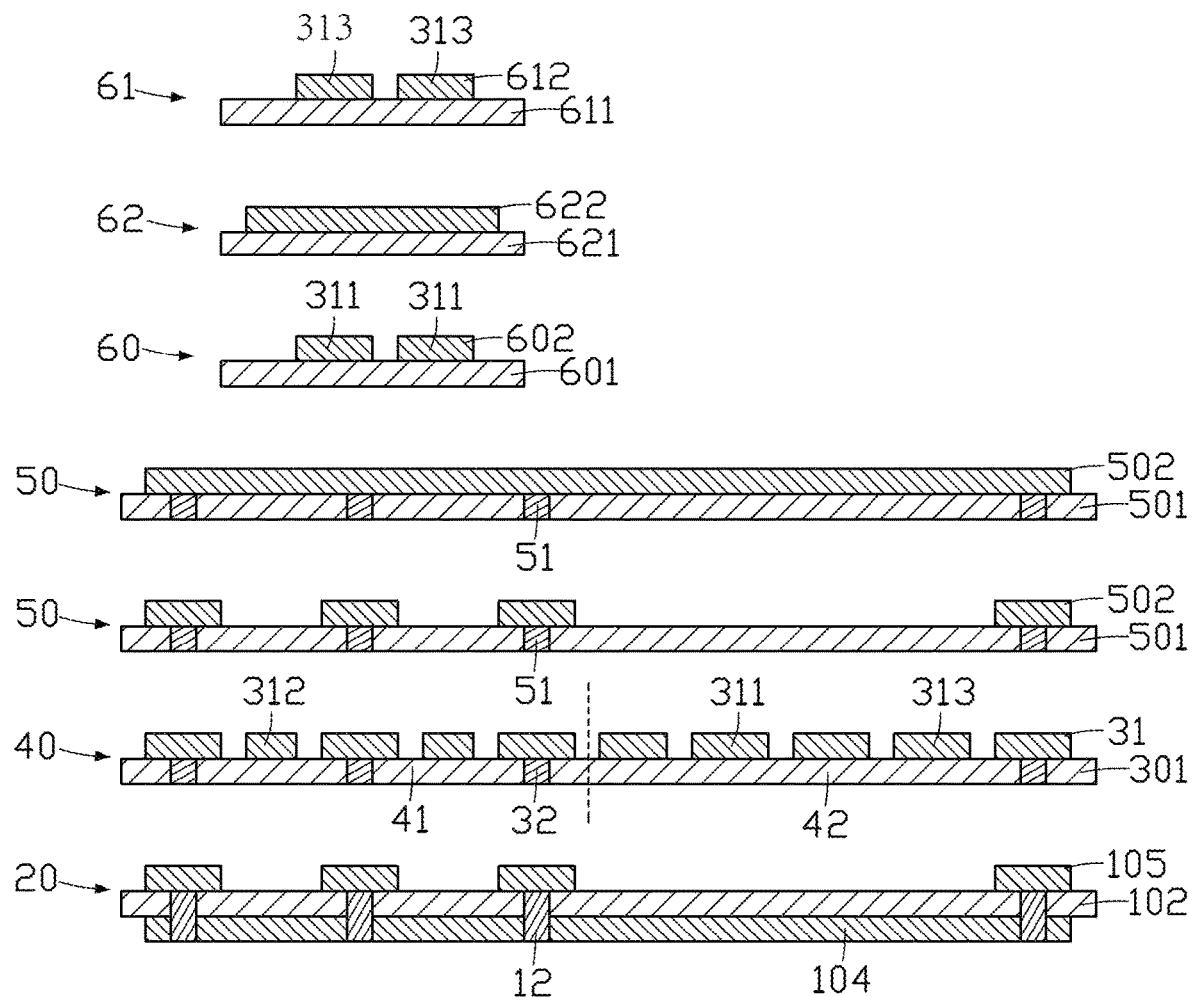
FIG. 9 is a diagrammatic view showing the first circuit board of FIG. 4, the second circuit board of FIG. 7, a third circuit board of FIG. 8, a fourth circuit board, a sixth circuit board, and a fifth circuit board being stacked together.

Step S10, referring to FIG. 9, provides a fourth circuit board 60.

The fourth circuit board 60 includes a fourth base layer 601 and a fifth conductive wiring layer 602. The difference between the fifth conductive wiring layer 602 and the third conductive wiring layer 31 is that the fifth conductive wiring layer 602 includes at least one power line 311, but does not include the signal line 312, the control line 313, the first ground lines, and the second ground line.

Step S11, a fifth circuit board 61 is provided.

The fifth circuit board 61 includes a fifth base layer 611 and a sixth conductive wiring layer 612. The difference between the sixth conductive wiring layer 612 and the third conductive wiring layer 31 is that the sixth conductive wiring layer 612 includes at least one control line 313, but does not include the signal line 312, the power line 311, the first ground lines, and the second ground line.

Step S12, a sixth circuit board 62 is provided.

The sixth circuit board 62 includes a sixth base layer 621 and a seventh conductive wiring layer 622. In an embodiment, the seventh conductive wiring layer 622 is a ground shielding layer.

Figure 10:
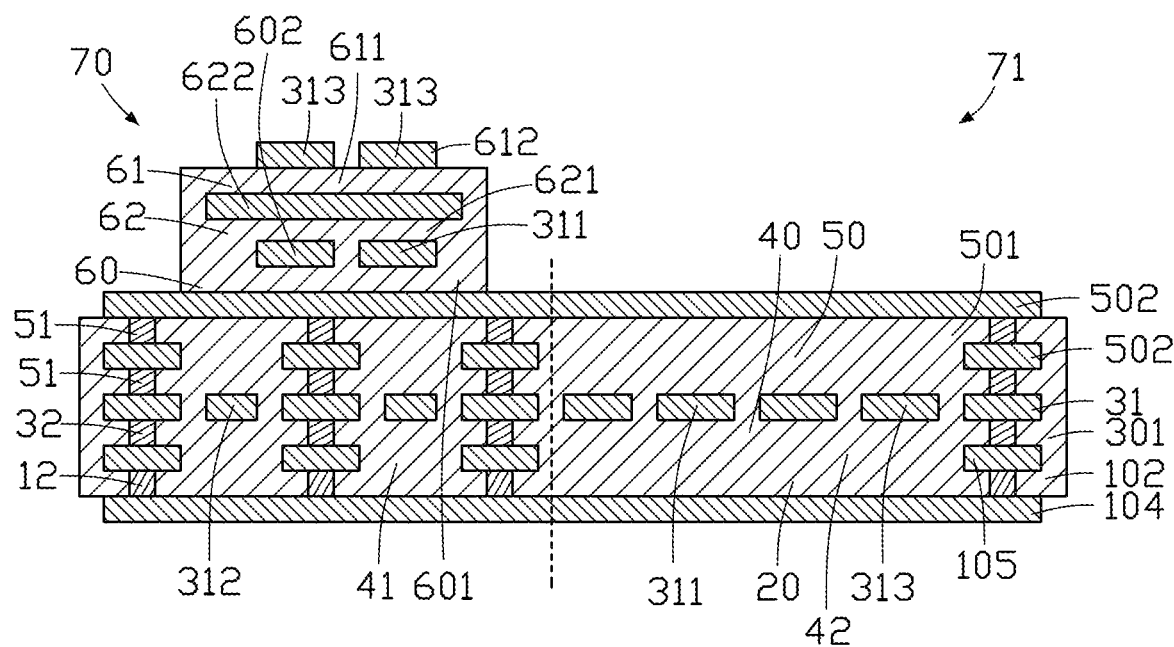
FIG. 10 is a diagrammatic view showing the first circuit board, the second circuit board, the third circuit board, the fourth circuit board, the sixth circuit board, and the fifth circuit board of FIG. 9 being pressed together.

Step S13, referring to FIG. 10, the first circuit board 20, the second circuit board 40, two third circuit boards 50, the fourth circuit board 60, the sixth circuit board 62, and the fifth circuit board 61 are stacked in that order and pressed, so that the second conductive portion 32 corresponds to the second conductive wiring layer 105, the third conductive portion 51 corresponds to the third conductive wiring layer 31, and each of the fourth circuit board 60, the sixth circuit board 62, and the fifth circuit board 61 corresponds to the first region 41. Then, an intermediate body 70 is obtained.

The first conductive wiring layer 104 and the fourth conductive wiring layer 502 are disposed at the outermost of the intermediate body 70. The fourth circuit board 60, the sixth circuit board 62, and the fifth circuit board 61 are disposed on the fourth conductive wiring layer 502.

Furthermore, the fourth circuit board 60, the sixth circuit board 62, and the fifth circuit board 61 have the same width. The first circuit board 20, the second circuit board 40, and the third circuit boards 50 have the same width. Since each of the fourth circuit board 60, the sixth circuit board 62, and the fifth circuit board 61 corresponds to 41 described in the first region 41, the width of the fourth circuit board 60, the sixth circuit board 62, and the fifth circuit board 61 is less than the width of the first circuit board 20, the second circuit board 40, and the third circuit boards 50.

In other embodiments, the order for stacking the fourth circuit board 60 and the fifth circuit board 61 may be interchanged.

After pressing, the first circuit board 20, the second circuit board 40, the third circuit boards 50, the fourth circuit board 60, the sixth circuit board 62, and the fifth circuit board 61 are connected to each other.

Since the width of the fourth circuit board 60, the sixth circuit board 62, and the fifth circuit board 61 is less than the width of the third circuit boards 50, a stepped portion 71 is formed on the third circuit boards 50 with respect to the fourth circuit board 60, the sixth circuit board 62, and the fifth circuit board 61.

Step S14, referring to FIG. 11, a solder mask layer 80 is formed on the intermediate body 70 to obtain the circuit board for transmitting high-frequency signal 100 (hereinafter, "circuit board 100").

The solder mask layer 80 covers the first circuit board 20 and the fifth circuit board 61. The solder mask layer 80 also covers the stepped portion 71 (that is, the solder mask layer 80 covers the sidewalls of the fourth circuit board 60, the sixth circuit board 62, and the fifth circuit board 61, and an outer surface of the third circuit board 50 not covered by the fifth circuit board 61). In an embodiment, an adhesive layer 81 is formed on the intermediate body 70 before forming the solder mask layer 80. Then, the solder mask 80 is formed on the adhesive layer 81. The solder mask layer 80 can protect the first circuit board 20, the third circuit boards 50, and the fifth circuit board 61.

The solder mask layer 80 can be made of a solder mask ink such as green oil. The adhesive layer 81 can be mad of polyethylene.

Each of the fourth circuit board 60, the fifth circuit board 61, and the sixth circuit board 62 also has a conductive portion (not shown), so that the fourth circuit board 60, the fifth circuit board 61, the sixth circuit board 62, the third circuit boards 50, the second circuit board 40, and the first circuit board 20 can be electrically connected to each other.

Step S15, the circuit board 100 is cut to form two terminal areas (not labeled) and a transmission line area (not labeled).

The transmission line area is disposed between the terminal areas. Each terminal area includes a portion of the circuit board 100 corresponding to the first region 41 and another portion of the circuit board 100 corresponding to the second region 42. The transmission line area includes another portion of the circuit board 100 corresponding to the first region 41. Each terminal areas can be connected to another electronic device (not shown).

In an embodiment, the first conductive portion 12, the second conductive portion 32, and the third conductive portion 51 are coaxial, which cooperatively form a conductive channel (not labeled). Each signal line 312 is disposed between two adjacent conductive channels. When at least two signal lines 312 are included, two adjacent signal lines 312 are separated by the conductive channel. In other embodiments, the first conductive portion 12, the second conductive portion 32, and the third conductive portion 51 may also be misaligned to each other to increase the flatness of the circuit board 100.

Figure 11:
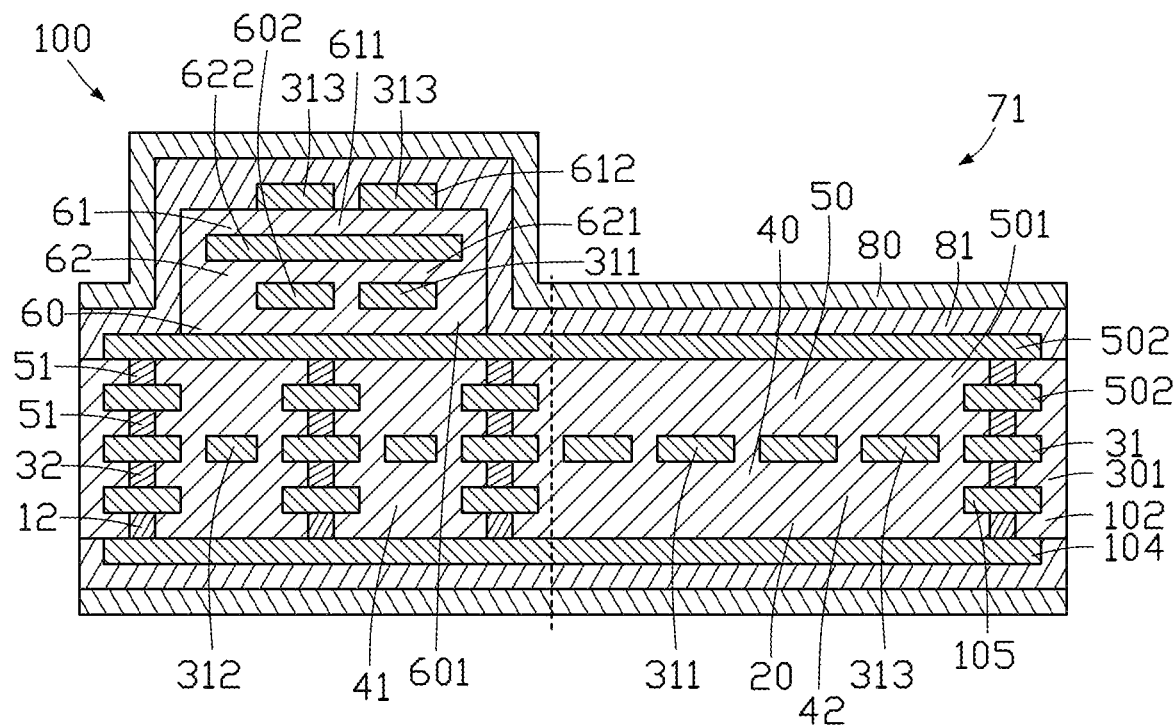
FIG. 11 is a diagrammatic view showing a solder mask layer being formed on the intermediate body of FIG. 10 to obtain a circuit board for transmitting high-frequency signal.

Referring to FIG. 11, the present disclosure further provides a circuit board 100, which includes a first circuit board 20, a second circuit board 40, a third circuit board 50, a fourth circuit board 60, a sixth circuit board 62, a fifth circuit board 61, and a solder mask layer 80.

The first circuit board 20 includes a first conductive wiring layer 104, a first base layer 102, and a second conductive wiring layer 105 stack in that order.

The first base layer 102 can be made of a resin selected from a group consisting of liquid crystal polymer (LCP), polyphenylene sulfide (PPS), poly tetra fluoroethylene (PTFE), epoxy resin, polypropylene (PP), BT resin, polyphenylene oxide (PPO), polyimide (PI), perfluoroalkoxy, polyethylene terephthalate (PET), and polyethylene naphthalate (PEN). In an embodiment, the first base layer 102 is made of polyimide.

At least one first conductive portion 12 is disposed in the first base layer 102, which is electrically connected to the first conductive wiring layer 104 and the second conductive wiring layer 105. The first conductive portion 12 can be made of a conductive paste (such as solder paste), metal (such as copper), etc. In an embodiment, the first conductive portion 12 is made of copper. The position and the number of the first conductive portion(s) 12 can be changed according to actual needs.

The second circuit board 40 is disposed on the second conductive wiring layer 105. The second circuit board 40 includes a second base layer 301 and a third conductive wiring layer 31 stacked together.

The second base layer 301 can be made of a resin selected from a group consisting of liquid crystal polymer (LCP), polyphenylene sulfide (PPS), poly tetra fluoroethylene (PTFE), epoxy resin, polypropylene (PP), BT resin, polyphenylene oxide (PPO), polyimide (PI), perfluoroalkoxy, polyethylene terephthalate (PET), and polyethylene naphthalate (PEN). In an embodiment, the second base layer 301 is made of polyimide.

At least one second conductive portion 32 is disposed in the second base layer 301, which is electrically connected to the third conductive wiring layer 31. The second conductive portion 32 corresponds to the second conductive wiring layer 105. The second conductive portion 32 can be made of a conductive paste (such as solder paste), metal (such as copper), etc. In an embodiment, the second conductive portion 32 is made of conductive paste. The position and the number of the second conductive portion(s) 32 can be changed according to actual needs.

The third conductive wiring layer 31 includes at least one power line 311, at least one signal line 312, at least one control line 313, at least two first ground lines (not label in the figures), and at least one second ground line (not label in the figures). The signal line 312 and the control line 313 are disposed on opposite sides of the power line 311. The first ground lines are disposed on opposite sides of the signal line 312. The second ground line is disposed on a side of the control line 313 away from the power line 311. The control line 313 can transmit a control signal.

The second circuit board 40 is divided into a first region 41 containing the signal line 312 and a second region 42 besides the first region 41. The power line 311 and the control line 313 are disposed in the second region 42.

The third circuit board 50 is disposed on the third conductive wiring layer 31. The third circuit board 50 includes a third base layer 501 and a fourth conductive wiring layer 502 stacked together.

The materials of the third base layer 501 can be made of a resin selected from a group consisting of liquid crystal polymer (LCP), polyphenylene sulfide (PPS), poly tetra fluoroethylene (PTFE), epoxy resin, polypropylene (PP), BT resin, polyphenylene oxide (PPO), polyimide (PI), perfluoroalkoxy, polyethylene terephthalate (PET), and polyethylene naphthalate (PEN). In an embodiment, the third base layer 501 is made of polyimide.

At least one third conductive portion 51 is disposed in the third base layer 501, which is electrically connected to the fourth conductive wiring layer 502. The third conductive portion 51 corresponds to the third conductive wiring layer 31. The third conductive portion 51 can be made of conductive paste (such as tin paste), metal (such as copper), etc. In an embodiment, the third conductive portion 51 is made of conductive paste. The position and the number of the third conductive portion(s) 51 can be changed according to actual needs.

The fourth circuit board 60 is disposed on the fourth conductive wiring layer 502 and corresponds to the first region 41. The fourth circuit board 60 includes a fourth base layer 601 and a fifth conducting line layer 602. The fifth conducting line layer 602 includes at least one power line 311 or at least one control line 313.

The fourth base layer 601 can be made of a resin selected from a group consisting of liquid crystal polymer (LCP), polyphenylene sulfide (PPS), poly tetra fluoroethylene (PTFE), epoxy resin, polypropylene (PP), BT resin, polyphenylene oxide (PPO), polyimide (PI), perfluoroalkoxy, polyethylene terephthalate (PET), and polyethylene naphthalate (PEN). In an embodiment, the fourth base layer 601 is made of polyimide.

The sixth circuit board 62 is disposed on the fifth conductive wiring layer 602 and corresponds to the first region 41. The sixth circuit board 62 includes a sixth base layer 621 and a seventh conductive wiring layer 622. In an embodiment, the seventh conductive wiring layer 622 is a ground shielding layer.

The sixth base layer 621 can be made of a resin selected from a group consisting of liquid crystal polymer (LCP), polyphenylene sulfide (PPS), poly tetra fluoroethylene (PTFE), epoxy resin, polypropylene (PP), BT resin, polyphenylene oxide (PPO), polyimide (PI), perfluoroalkoxy, polyethylene terephthalate (PET), and polyethylene naphthalate (PEN). In an embodiment, the sixth base layer 621 is made of polyimide.

The fifth circuit board 61 is disposed on the seventh conductive wiring layer 622 and corresponds to the first region 41. The fifth circuit board 61 includes a fifth base layer 611 and a sixth conductive wiring layer 612. The sixth conductive wiring layer 612 includes at least one power line 311 or at least one control line 313.

The fifth base layer 611 can be made of a resin selected from a group consisting of liquid crystal polymer (LCP), polyphenylene sulfide (PPS), poly tetra fluoroethylene (PTFE), epoxy resin, polypropylene (PP), BT resin, polyphenylene oxide (PPO), polyimide (PI), perfluoroalkoxy, polyethylene terephthalate (PET), and polyethylene naphthalate (PEN). In an embodiment, the fifth base layer 611 is made of polyimide.

Furthermore, the fourth circuit board 60, the sixth circuit board 62, and the fifth circuit board 61 have the same width. The first circuit board 20, the second circuit board 40 and the third circuit board 50 have the same width. Since each of the fourth circuit board 60, the sixth circuit board 62, and the fifth circuit board 61 corresponds to 41 described in the first region 41, the width of the fourth circuit board 60, the sixth circuit board 62, and the fifth circuit board 61 is less than the width of the first circuit board 20, the second circuit board 40, and the third circuit board 50.

In other embodiments, the positions of the fourth circuit board 60 and the fifth circuit board 61 may be interchanged. That is, the fifth circuit board 61 is disposed on the fourth conductive wiring layer 502, the sixth circuit board 62 is disposed on the sixth conductive wiring layer 612, and the fourth circuit board 60 is disposed on the seventh conductive wiring layer 622.

Since the width of the fourth circuit board 60, the sixth circuit board 62 and the fifth circuit board 61 is less than the width of the third circuit board 50, a stepped portion 71 is formed on the third circuit board 50 with respect to the fourth circuit board 60, the sixth circuit board 62, and the fifth circuit board 61.

The solder mask layer 80 covers the first circuit board 20 and the fifth circuit board 61. The solder mask layer 80 also covers the stepped portion 71 (that is, the solder mask layer 80 covers the sidewalls of the fourth circuit board 60, the sixth circuit board 62, and the fifth circuit board 61, and an outer surface of the third circuit board 50 not covered by the fifth circuit board 61). In an embodiment, an adhesive layer 81 is formed on the intermediate body 70 before forming the solder mask layer 80. Then, the solder mask 80 is formed on the adhesive layer 81. The solder mask layer 80 can protect the first circuit board 20, the third circuit boards 50, and the fifth circuit board 61. The solder mask layer 80 can be made of a solder mask ink such as green oil. The adhesive layer 81 can be mad of polyethylene.

Each of the fourth circuit board 60, the fifth circuit board 61, and the sixth circuit board 62 also has a conductive portion (not shown), so that the fourth circuit board 60, the fifth circuit board 61, the sixth circuit board 62, the third circuit boards 50, the second circuit board 40, and the first circuit board 20 can be electrically connected to each other.

The circuit board 100 includes two terminal areas (not labeled) and a transmission line area (not labeled) between the terminal areas. Each terminal area includes a portion of the circuit board 100 corresponding to the first region 41 and another portion of the circuit board 100 corresponding to the second region 42. The transmission line area includes another portion of the circuit board 100 corresponding to the first region 41. The terminal area can be connected to another electronic device (not shown).

In an embodiment, the first conductive portion 12, the second conductive portion 32, and the third conductive portion 51 are coaxial, which cooperatively form a conductive channel (not labeled). Each signal line 312 is disposed between two adjacent conductive channels. When at least two signal lines 312 are included, two adjacent signal lines 312 are separated by the conductive channel. In other embodiments, the first conductive portion 12, the second conductive portion 32, and the third conductive portion 51 may also be misaligned to each other to increase the flatness of the circuit board 100.

In the present disclosure, the power line 311 and the control line 313 in the transmission line area of the circuit board 100 are vertically disposed above the signal line 312, thereby preventing the power line 311, the control line 313, and the signal line 312 from being on a same horizontal position. Thus, the width of the transmission line area can be reduced. In addition, the power line 311 and the control line 313 are separated arranged, that is, the power line 311 and the control line 313 are isolated from each other by the seventh conductive wiring layer 622, thereby avoiding the mutual interference between the power line 311 and the control line 313, thus improve the signal transmission quality.

The embodiments shown and described above are only examples. Changes may be made in the detail within the principles of the present disclosure, up to and including the full extent established by the broad general meaning of the terms used in the claims. It will therefore be appreciated that the embodiments described above may be modified within the scope of the claims.

What is claimed is:
1. A circuit board for transmitting high-frequency signal, comprising:

a first circuit board comprising a first conductive wiring layer, a first base layer, and a second conductive wiring layer stacked in that order;

a second circuit board comprising a second base layer and a third conductive wiring layer stacked together, the third layer comprising at least one power line, at least one signal line, at least two first ground lines, at least one second ground lines, the signal line and the control line disposed at opposite sides of the power line, the first ground lines disposed at opposite sides of the signal line, the second ground line disposed at a side of the control line away from the power line, the second circuit board divided into a first region containing the signal line and a second region besides the first region, the second region the power line and the control line disposed in the second region;

at least one third circuit board each comprising a third base layer and a fourth conductive wiring layer stacked together;

a fourth circuit board comprising a fourth base layer and a fifth conductive wiring layer stacked together, the fifth conductive wiring layer comprising at least one power line or at least one control line;

a sixth circuit board comprising a sixth base layer and a seventh conductive wiring layer stacked together;

a fifth circuit board comprising a fifth base layer and a sixth conductive wiring layer stacked together, and the sixth conductive wiring layer comprising at least one power line or at least one control line;

wherein the first circuit board, the second circuit board, the third circuit boards are stacked in that order, the fourth circuit board, the sixth circuit board, and the fifth circuit board are disposed on the third circuit board and correspond to the first region, the sixth circuit board is disposed between the fourth circuit board and the fifth circuit board.

2. The circuit board of claim 1, wherein a stepped portion is formed between the fourth circuit board, the sixth circuit board, the fifth circuit board, and the third circuit board, the circuit board further comprises a solder mask layer formed on the first circuit board and the fifth circuit board, the solder mask layer further covers the stepped portion.

3. The circuit board of claim 1, wherein the circuit board comprises two terminal areas and a transmission line area between the terminal areas, each terminal area comprise a portion of the circuit board corresponding to the first region and another portion of the circuit board corresponding to the second region, the transmission line area comprises another portion of the circuit board corresponding to the first region.

4. A method for manufacturing a circuit board for transmitting high-frequency signal, comprising:

providing a first circuit board, the first circuit board comprising a first conductive wiring layer, a first base layer, and a second conductive wiring layer stacked in that order;

providing a second circuit board, the second circuit board comprising a second base layer and a third conductive wiring layer stacked together, the third conductive wiring layer comprising at least one power line, at least one signal line, at least one control line, at least two first ground lines, and at least one second ground line, the signal line and the control line disposed at opposite sides of the power line, the first ground lines disposed at opposite sides of the signal line, the second ground line disposed at a side of the control line away from the power line, the second circuit board divided into a first region containing the signal line and a second region besides the first region, the second region the power line and the control line disposed in the second region;

providing at least one third circuit board, each third circuit board comprising a third base layer and a fourth conductive wiring layer stack together;

providing a fourth circuit board, the fourth circuit board comprising a fourth base layer and a fifth conductive wiring layer stacked together, the fifth conductive wiring layer comprising at least one power line or at least one control line;

providing a fifth circuit board, the fifth circuit board comprising a fifth base layer and a sixth conductive wiring layer stacked together, and the sixth conductive wiring layer comprising at least one power line or at least one control line;

providing a sixth circuit board, the sixth circuit board comprising a sixth base layer and a seventh conductive wiring layer stacked together, the seventh conductive wiring layer being a ground shielding layer;

stacking the first circuit board, the second circuit board, and the third circuit board, and stacking the fourth circuit board, the sixth circuit board, and the fifth circuit board on the third circuit board, causing the sixth circuit board to be between the fourth circuit board and the fifth circuit board, and pressing them to cause each of the fourth circuit board, the sixth circuit board, and the fifth circuit board to correspond to the first region.

5. The method of claim 4, wherein a method for manufacturing the first circuit board comprises:

providing a first copper-clad laminate, the first copper-clad laminate comprising a first copper foil layer, the first base layer, and a second copper foil layer stack in that order;

defining at least one first blind hole in the first copper-clad laminate, each first blind hole penetrating the first copper foil layer and the first base layer;

forming a first conductive portion in each first blind hole by electroplating;

etching the first copper foil layer and the second copper foil layer to form the first conductive wiring layer and the second conductive wiring layer, respectively, causing the first conductive wiring layer and the second conductive wiring layer to electrically connect to each other through the first conductive portion.

6. The method of claim 1, wherein a method for manufacturing the second circuit board comprises:

providing a second copper-clad laminate, the second copper-clad laminate comprising the second base layer and a third copper foil layer stacked together;

etching the third copper foil layer form the third conductive wiring layer;

defining at least one second blind hole in the second copper-clad laminate, each second blind hole penetrating through the second base layer;

filling a conductive material in each second blind hole to form a second conductive portion, which is electrically connected to the third conductive wiring layer.

7. The method of claim 4, wherein a method for manufacturing the third circuit board comprising:

providing a third copper-clad laminate, the third copper-clad laminate comprising a third base layer and a fourth copper foil layer stacked together;

etching the fourth copper foil layer to form the fourth conductive wiring layer;

defining at least one third blind hole in the third copper-clad laminate, each third blind hole penetrating the third base layer;

filling a conductive material in each third blind hole to form a third conductive portion, which is electrically connected to the fourth conductive wiring layer.

8. The method of claim 7, wherein after the pressing, the second conductive portion is electrically connected to the second conductive wiring layer, the third conductive portion is electrically connected to the third conductive wiring layer, the first conductive portion, the second conductive portion, and the third conductive portion are coaxial and cooperatively form a conductive channel, each second circuit board comprises at least two signal line, and two adjacent of the signal lines are isolated from each other by the conductive channel.

9. The method of claim 4, wherein a stepped portion is formed between the fourth circuit board, the sixth circuit board, the fifth circuit board, and the third circuit board, after the pressing, the method for manufacturing the circuit board further comprises:

forming a solder mask layer on the first circuit board and the fifth circuit board, the solder mask layer further covering the stepped portion.

10. The method of claim 4, further comprises:

cutting the circuit board to form two terminal areas and a transmission line area between the terminal areas, each terminal area comprising a portion of the circuit board corresponding to the first region and another portion of circuit board corresponding to the second region, the transmission line area comprising another portion of the circuit board corresponding to the first region.

\* \* \* \* \*